(12) United States Patent
Wu et al.

(10) Patent No.: US 9,225,363 B2
(45) Date of Patent: Dec. 29, 2015

(54) DIGITAL PRE-DISTORTION TRANSMITTER AND METHOD FOR CONTROLLING THE SAME

(71) Applicant: FUJITSU LIMITED, Kawasaki-shi, Kanagawa (JP)

(72) Inventors: Donglin Wu, Beijing (CN); Jie Wu, Beijing (CN); Pei Chen, Beijing (CN); Jianmin Zhou, Beijing (CN); Takanori Iwamatsu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/473,964

(22) Filed: Aug. 29, 2014

(65) Prior Publication Data

US 2015/0071382 A1  Mar. 12, 2015

(30) Foreign Application Priority Data

Sep. 12, 2013 (CN) .......................... 2013 1 0414913

(51) Int. Cl.
| | |
|---|---|
| H04K 1/02 | (2006.01) |
| H04B 1/04 | (2006.01) |
| H03F 1/32 | (2006.01) |
| H03F 3/24 | (2006.01) |
| H03F 1/02 | (2006.01) |
| H03F 1/30 | (2006.01) |
| H03F 3/189 | (2006.01) |

(52) U.S. Cl.
CPC ............ *H04B 1/0475* (2013.01); *H03F 1/0238* (2013.01); *H03F 1/30* (2013.01); *H03F 1/3247* (2013.01); *H03F 3/189* (2013.01); *H03F 3/245* (2013.01); *H03F 2200/336* (2013.01); *H03F 2200/447* (2013.01); *H03F 2200/78* (2013.01); *H03F 2201/3215* (2013.01); *H03F 2201/3227* (2013.01); *H04B 2001/045* (2013.01); *H04B 2001/0425* (2013.01); *H04B 2001/0433* (2013.01); *H04B 2001/0441* (2013.01)

(58) Field of Classification Search
None
See application file for complete search history.

(56) References Cited

U.S. PATENT DOCUMENTS

2008/0260066 A1* 10/2008 Cai et al. ........................ 375/297
2012/0256686 A1* 10/2012 Royer ............................ 330/149

* cited by examiner

*Primary Examiner* — Adolf Dsouza
(74) *Attorney, Agent, or Firm* — Arent Fox LLP

(57) ABSTRACT

The present disclosure provides a digital pre-distortion transmitter and a method for controlling the same, which increase the efficiency of the power amplifier and improve the linearity of the transmitter. The digital pre-distortion transmitter includes: a pre-distortion unit configured to update a pre-distortion coefficient required by pre-distortion processing, and perform the pre-distortion processing on a baseband signal; a signal process and transmit unit configured to perform signal processing on the pre-distortion-processed baseband signal and transmission thereof; and a feedback signal process unit configured to process a feedback signal of the signal transmitted by the signal process and transmit unit, so as to supply a dynamic drain voltage to a power amplifier in the signal process and transmit unit by using the processed feedback signal; and, the pre-distortion unit updates the pre-distortion coefficient by using the feedback signal processed by the feedback signal process unit.

18 Claims, 14 Drawing Sheets

DIGITAL PRE-DISTORTION TRANSMITTER AND METHOD FOR CONTROLLING THE SAME

CROSS REFERENCE TO RELATED APPLICATIONS

This application claims priority to Chinese Patent Application No. 201310414913.3, filed Sep. 12, 2013, which is hereby incorporated by reference in its entirety.

TECHNICAL FIELD

The present disclosure relates to the transmitter technology, and particularly, to a Digital Pre-Distortion (DPD) transmitter and a method for controlling the same.

BACKGROUND

With the development of the communication technology, particularly, the rapid development of the wideband communication technology, various modulation modes with high spectrum efficiencies are widely used, wherein the problem of high Peak-to-Average Power Ratios (PAPR) also makes a higher requirement to the linearization technology of the power amplifier (HPA).

Among the linearization technology of the power amplifier, the Digital Pre-Distortion (DPD) technology is a widely used and effective method. The basic principle is to perform pre-distortion processing on a transmitted signal through a pre-distorter having characteristics opposite to the nonlinear characteristics of the power amplifier, before amplifying the signal through the power amplifier, so as to modify the nonlinear characteristics of the whole pre-distortion device (e.g., the transmitter system), thus the whole system presents the linear characteristics so far as possible.

On the other hand, in order to improve the efficiency of the power amplifier, the power supply modulation technology is provided, which is a simple and effective scheme, and the principle is to dynamically adjust the drain bias voltage of the power amplifier according to the output power of the power amplifier, and reduce the DC power consumption of the small-power output, so that the efficiency of the whole system is improved.

To be noted, the above introduction to the technical background is just made for the convenience of clearly and completely describing the technical solutions of the present disclosure, and to facilitate the understanding by a person skilled in the art. It shall not be deemed that the above technical solutions are known to a person skilled in the art just because they have been illustrated in the Background section of the present disclosure.

SUMMARY

The inventor finds that the existing voltage modulation schemes for the power amplifier have their respective shortages.

In the envelope tracking amplifier, the drain voltage of the power amplifier is adjusted in real time according to the envelope information to be inputted into the power amplifier, but the signal bandwidth of the transmission is restricted by the switching rate of the DC-DC converter. In some dynamic voltage schemes based on the power tracking, the output power of the power amplifier may be controlled through a Transmission Power Control (TPC) signal, but the actual output power of the power amplifier cannot be determined accurately. Some schemes need to convert the digital control signal into the analog signal with a Digital to Analog Converter (DAC), which increases the hardware cost of the system. Some schemes modify the nonlinearity of the power amplifier with a vector DPD, which requires a strict synchronization and a complex algorithm, thus also increasing the cost and complexity of the system.

The embodiments of the present disclosure provide a digital pre-distortion transmitter and a method for controlling the same, which increase the efficiency of the power amplifier and improve the linearity of the transmitter.

According to an aspect of the present disclosure, a digital pre-distortion transmitter is provided, including:

a pre-distortion unit configured to update a pre-distortion coefficient required by pre-distortion processing, and perform the pre-distortion processing on a baseband signal;

a signal process and transmit unit configured to perform signal processing on the pre-distortion-processed baseband signal and transmission thereof; and a feedback signal process unit configured to process a feedback signal of the signal transmitted by the signal process and transmit unit, so as to supply a dynamic drain voltage to a power amplifier in the signal process and transmit unit by using the processed feedback signal;

wherein, the pre-distortion unit updates the pre-distortion coefficient by using the feedback signal processed by the feedback signal process unit.

According to another aspect of the present disclosure, a method for controlling a digital pre-distortion transmitter is provided, including:

updating a pre-distortion coefficient required by pre-distortion processing, and performing the pre-distortion processing on a baseband signal;

performing signal processing on the pre-distortion-processed baseband signal and transmission thereof; and processing a feedback signal of the transmitted signal, so as to supply a dynamic drain voltage to a power amplifier for the signal processing by using the processed feedback signal;

wherein, the pre-distortion coefficient is updated by using the processed feedback signal.

The present disclosure has the following beneficial effects: the feedback signal of the transmitted signal is processed, and the drain voltage of the power amplifier is controlled by using the processed feedback signal, thus the efficiency of the power amplifier is increased; in addition, the pre-distortion coefficient of the pre-distortion unit is updated by using the processed feedback signal, thus the linearity of the power amplifier is further improved.

The particular embodiments of the present disclosure are specifically disclosed with reference to the subsequent descriptions and drawings to indicate the implementations of the principle of the present disclosure. It shall be appreciated that the scope of the embodiments of the present disclosure is not limited thereto, and the embodiments of the present disclosure include various changes, modifications and equivalents falling within the scope of the spirit and the clauses of the accompanied claims.

Features described and/or illustrated with respect to one embodiment can be used in one or more other embodiments in a same or similar way, and/or by being combined with or replacing the features in other embodiments.

To be noted, the term "comprise/include" used herein specifies the presence of feature, element, step or component, not excluding the presence or addition of one or more other features, elements, steps or components or combinations thereof.

DESCRIPTION OF THE EMBODIMENTS

The aforementioned and other features of the present disclosure will be apparent through the following descriptions with reference to the drawings. The descriptions and drawings specifically disclose the particular embodiments of the present disclosure, which are some of the embodiments where the principle of the present disclosure can be adopted. To be noted, the present disclosure is not limited to the described embodiments. On the contrary, the present disclosure includes any amendment, modification and their equivalents falling in the scope of the accompanied claims.

Embodiment 1

Figure 1:
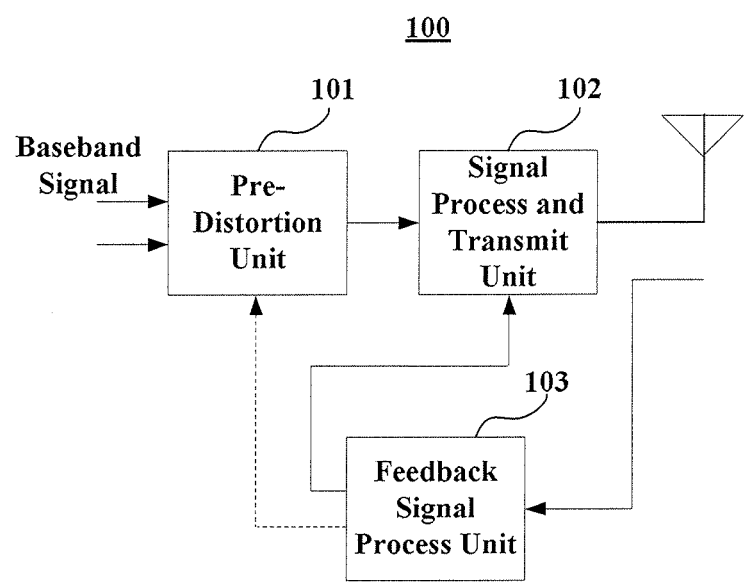
FIG. 1 is a schematic diagram of the structure of a digital pre-distortion transmitter according to Embodiment 1 of the present disclosure.

FIG. 1 is a schematic diagram of the structure of a digital pre-distortion transmitter according to Embodiment 1 of the present disclosure. As illustrated in FIG. 1, a digital pre-distortion transmitter 100 includes a pre-distortion unit 101, a signal process and transmit unit 102 and a feedback signal process unit 103;

in which, the pre-distortion unit 101 updates a pre-distortion coefficient required by pre-distortion processing, and performs the pre-distortion processing on a baseband signal; the signal process and transmit unit 102 performs signal processing on the pre-distortion-processed baseband signal and transmission thereof; and the feedback signal process unit 103 processes a feedback signal of the signal transmitted by the signal process and transmit unit 102, so as to supply a dynamic drain voltage to a power amplifier in the signal process and transmit unit by using the processed feedback signal.

The pre-distortion processing performed by the pre-distortion unit 101, and the signal processing and transmission performed by the signal process and transmit unit 102 may be implemented by using any one of the existing technologies, which is omitted herein.

In this embodiment, the feedback signal process unit 103 may couple a radio signal at an output end of the signal process and transmit unit 102 to obtain the feedback signal. In addition, the feedback signal process unit 103 further processes the feedback signal, and supplies the dynamic drain voltage to the power amplifier in the signal process and transmit unit 102 by using the processed feedback signal.

In this embodiment, the feedback signal process unit 103 may process the feedback signal to obtain in-band power of the feedback signal or a voltage signal reflecting the in-band power. The in-band power or the voltage signal reflecting the in-band power can supply a dynamic drain voltage to the power amplifier.

Moreover, in this embodiment, the feedback signal process unit 103 can obtain out-band power of the feedback signal by processing the feedback signal, wherein the out-band power may be transmitted to the pre-distortion unit 101 to update the pre-distortion coefficient of the pre-distortion unit 101, as shown by the dotted lines in FIG. 1.

As can be seen from the above embodiment, by processing the feedback signal of the transmitted signal and controlling the drain voltage of the power amplifier with the processed feedback signal, the efficiency of the power amplifier is increased. In addition, by updating the pre-distortion coefficient of the pre-distortion unit with the processed feedback signal, the linearity of the power amplifier is further improved.

Embodiment 2

Figure 2:
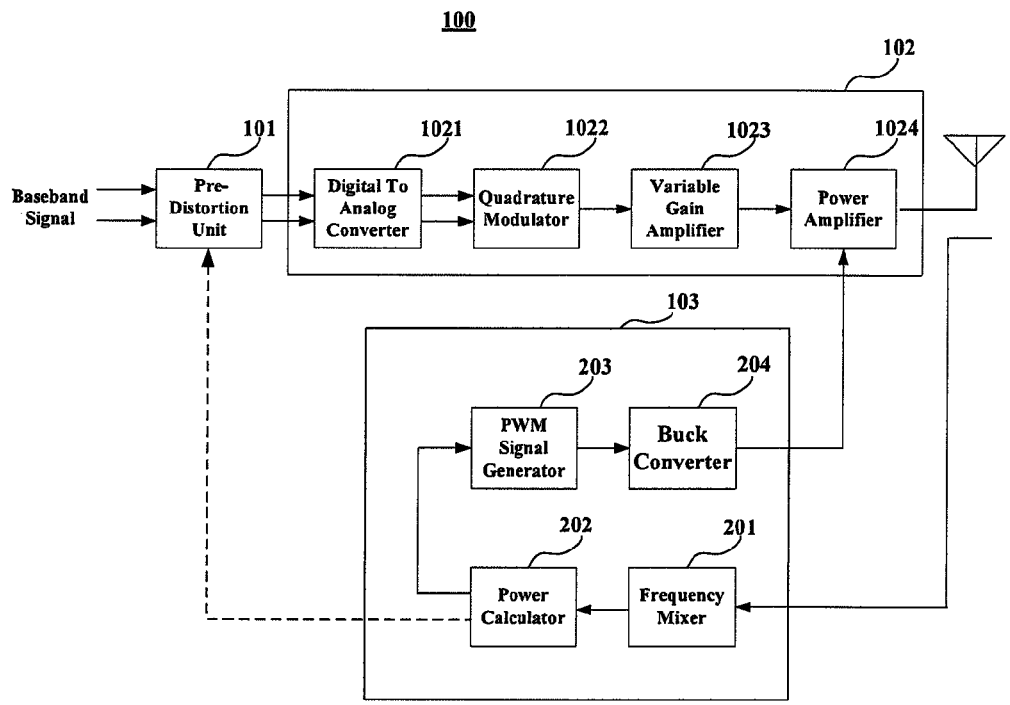
FIG. 2 is a schematic diagram of the structure of a digital pre-distortion transmitter according to Embodiment 2 of the present disclosure.

FIG. 2 is a schematic diagram of the structure of a digital pre-distortion transmitter according to Embodiment 2 of the present disclosure. On the basis of Embodiment 1, as illustrated in FIG. 2, in the digital pre-distortion transmitter 100, the signal process and transmit unit 102 may include a Digital to Analog Converter (DAC) 1021, a Quadrature Modulator (QMOD) 1022, a Variable Gain Amplifier (VGA) 1023, a power amplifier (High Power Amplifier, HPA) 1024.

As illustrated in FIG. 2, a baseband signal processed by the pre-distortion unit 101 is transmitted to the power amplifier 1024 via the digital to analog converter 1021, the quadrature modulator 1022 and the variable gain amplifier 1023, for performing the amplification processing, and then the amplification-processed signal is transmitted. The working principles of each unit in the signal process and transmit unit 102 may be implemented by using any one of the existing technology, which is omitted herein.

In this embodiment, as illustrated in FIG. 2, the feedback signal process unit 103 includes a frequency mixer 201, a power calculator 202, a pulse width modulation signal generator 203 and a buck converter 204;

in which, the frequency mixer 201 is configured to convert the feedback signal into a baseband signal having a center frequency of zero; the power calculator 202 is configured to calculate in-band power of the feedback signal processed by the frequency mixer 201 (i.e., the baseband signal having a center frequency of zero, also referred to as zero-center-frequency baseband signal) or a voltage signal reflecting the in-band power, and out-band power; the pulse width modulation (PWM) signal generator 203 is configured to generate a pulse width modulation signal according to the in-band power or the voltage signal reflecting the in-band power; and the buck converter 204 is configured to generate the dynamic drain voltage according to the pulse width modulation signal.

Figure 3:
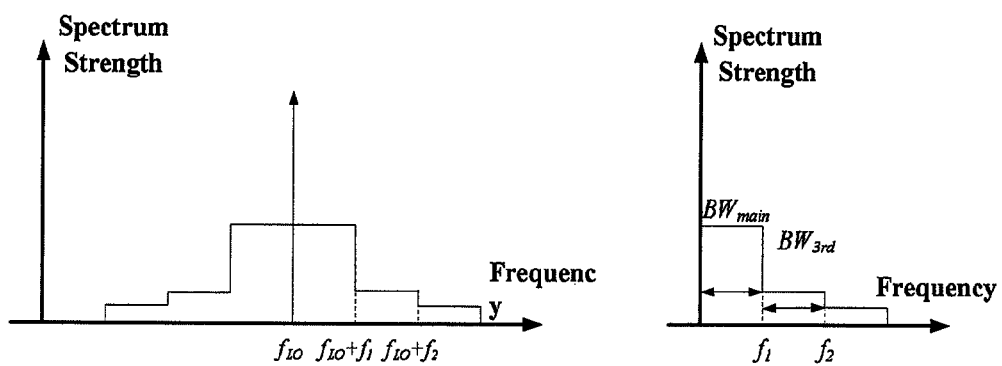
FIG. 3 is a schematic diagram of signal spectrums before and after a frequency mixer.

FIG. 3 is a schematic diagram of signal spectrums before and after the frequency mixer. As illustrated in FIG. 3, the center frequency of the unprocessed feedback signal is the same as the frequency of the local oscillation (LO) signal, both being $f_{lo}$; the feedback signal processed by the frequency mixer 201 is a baseband signal having a center frequency of zero, i.e., a zero-center-frequency baseband signal.

In this embodiment, the feedback signal processed by the frequency mixer 201 is inputted into the power calculator 202. In the power calculator 202, the in-band power of the zero-center-frequency baseband signal is obtained through a calculation of the zero-center-frequency baseband signal. Next, the power calculator 202 is described with reference to FIGS. 4 and 5, but the method for calculating the in-band power is not limited to those described herein.

Figure 4:
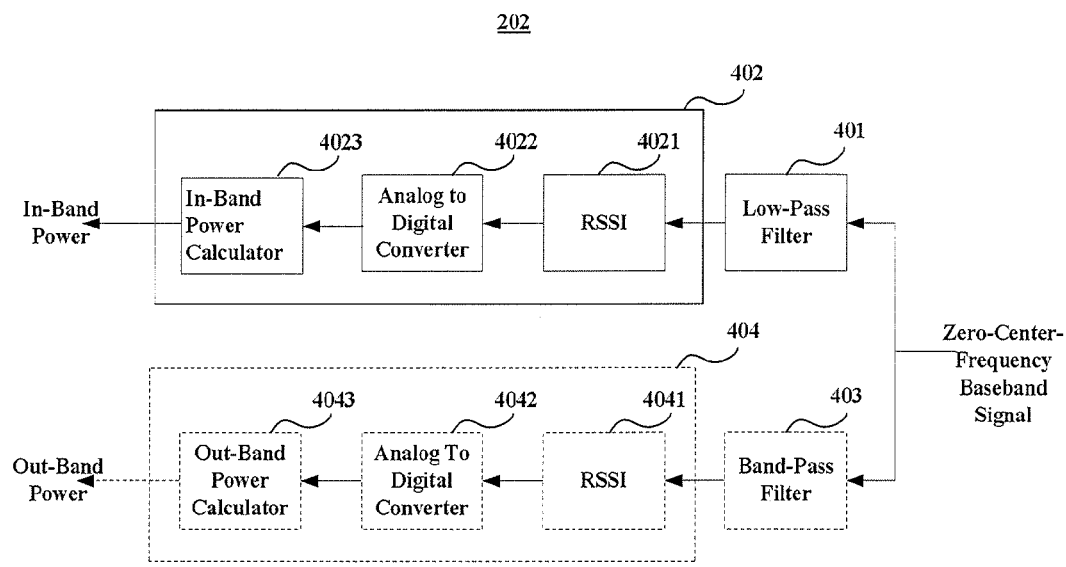
FIG. 4 is a schematic diagram of the structure of a power calculator according to Embodiment 2 of the present disclosure.

FIG. 4 is a schematic diagram of the structure of a power calculator according to Embodiment 2 of the present disclosure. As illustrated in FIG. 4, the power calculator 202 includes a low-pass filter 401, a first power calculator 402, a band-pass filter 403 and a second power calculator 404;

in which, the low-pass filter 401 is configured to perform a low-pass filtration on the zero-center-frequency baseband signal; the first power calculator 402 is configured to calculate the in-band power according to the low-pass filtered signal; the band-pass filter 403 is configured to perform a band-pass filtration on the zero-center-frequency baseband signal; and the second power calculator 404 is configured to calculate the out-band power according to the band-pass filtered signal.

In this embodiment, the low-pass filter 401 may be an Analog Low-Pass Filter (ALPF), which has a cut-off frequency $f_1$ and a bandwidth $BW_{main}$. The main channel in-band power signal of the zero-center-frequency baseband signal can be obtained after a filtration performed by the analog low-pass filter.

The first power calculator 402 calculates the main channel in-band power signal obtained by the analog low-pass filter, so as to obtain the in-band power. In a specific embodiment, the first power calculator 402 may include a Received Signal Strength Indicator (RSSI) 4021, an analog to digital converter 4022 and an in-band power calculator 4023; in which, the received signal strength indicator 4021 is configured to extract strength information of the main channel in-band power signal; the analog to digital converter 4022 may convert the strength information into a digital value under the control of a sample control signal (not illustrated) having a frequency $f_s$; and the in-band power calculator 4023 calculates a module value, a squared value, an average value and a logarithm to obtain the in-band power.

In this embodiment, the first power calculator 402 may directly take the output of the analog to digital converter 4022 as the voltage signal reflecting the in-band power, rather than being provided with the in-band power calculator 4023. When the voltage signal is used, an averaging processing may be performed thereon.

In this embodiment, the band-pass filter 403 may be an Analog Band-Pass Filter (ABPF), which has a cut-off frequency $f_1$ of an upper sideband, a cut-off frequency $f_2$ of a lower sideband, and a bandwidth $BW_{3rd}$. The third order power signal of the zero-center-frequency baseband signal can be obtained through the filtration performed by the analog band-pass filter.

The second power calculator 404 performs a calculation of the power signal obtained by the analog band-pass filter, so as to obtain an out-band power, which may be out-band third order power. In this embodiment, the second power calculator 404 may include a Received Signal Strength Indicator (RSSI) 4041, an analog to digital converter 4042 and an out-band power calculator 4043; in which, the received signal strength indicator 4041 is configured to extract strength information of the third order power signal; the analog to digital converter 4042 converts the strength information into a digital sampled signal, and the analog to digital converter 4042 may also work under the control of a sample control signal (not illustrated) having a frequency fs; and the out-band power calculator 4043 is configured to calculate out-band third order power of the feedback signal according to the digital sample signal, and the method for calculating the out-band third order power may be the same as that used by the in-band power calculator 4023.

Figure 5:
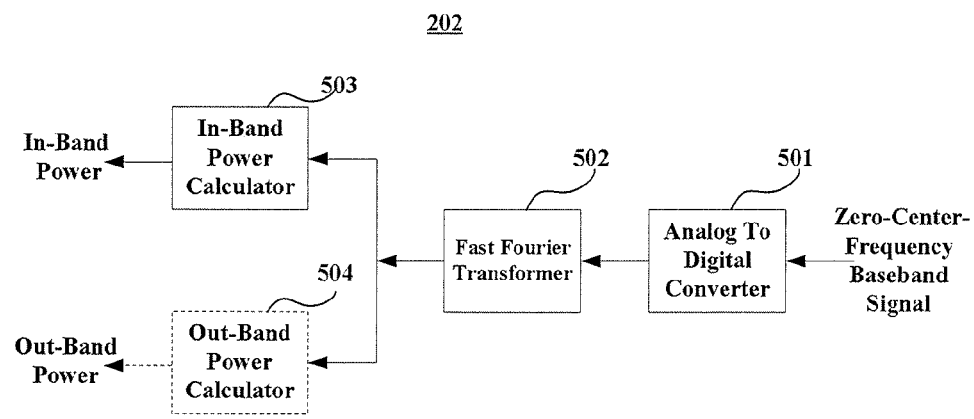
FIG. 5 is another schematic diagram of the structure of a power calculator according to Embodiment 2 of the present disclosure.

FIG. 5 is another schematic diagram of the structure of a power calculator according to Embodiment 2 of the present disclosure. As illustrated in FIG. 5, the power calculator 202 includes an analog to digital converter 501, a fast Fourier transformer 502, an in-band power calculator 503 and an out-band power calculator 504; in which, the analog to digital converter 501 is configured to perform an analog to digital conversion on the feedback signal processed by the frequency mixer, so as to generate a digital sample signal; the fast Fourier transformer 502 is configured to perform a fast Fourier transform of the digital sample signal; the in-band power calculator 503 is configured to calculate the in-band power according to the fast Fourier transformed signal; and the out-band power calculator 504 is configured to calculate the out-band power according to the fast Fourier transformed signal.

In this embodiment, the analog to digital converter 501 converts the zero-center-frequency baseband signal into a digital sample signal, which is fed into the fast Fourier transformer 502 to perform a Fourier transform. The Fourier transformed signal is fed into the in-band power calculator 503 to generate the in-band power. The out-band power calculator 504 performs a calculation of the Fourier transformed signal to obtain the out-band power. Specifically, the out-band power may be out-band third order power. The specific working modes of the analog to digital converter 501, the fast Fourier transformer 502, the in-band power calculator 503 and the out-band power calculator 504 are similar to those in the relevant art, and herein are omitted.

In this embodiment, the pulse width modulation signal generator 203 generates a pulse width modulation signal according to the in-band power obtained by the power calculator. Next, the generation of the pulse width modulation signal is described with reference to the drawings.

Figure 6:
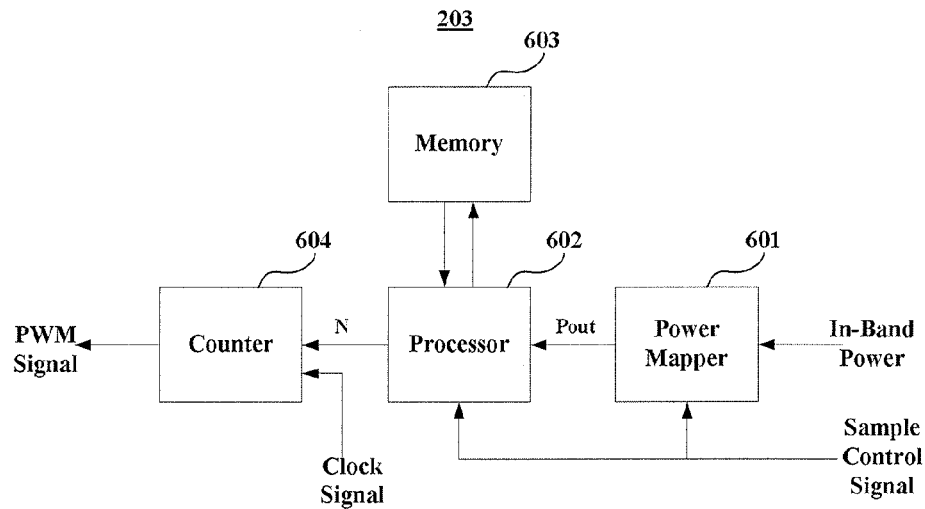
FIG. 6 is a schematic diagram of the structure of a pulse width modulation signal generator according to Embodiment 2 of the present disclosure.

FIG. 6 is a schematic diagram of the structure of a pulse width modulation signal generator according to Embodiment 2 of the present disclosure. As illustrated in FIG. 6, the pulse width modulation signal generator 203 includes a power mapper 601, a processor 602, a memory 603 and a counter 604;

in which, the power mapper 601 is configured to map the in-band power into output power of the power amplifier; the processor 602 is configured to determine a value N according to the output power and a pre-stored correspondence between the output power and the value N, wherein N represents the number of high levels in M continuous clock sequences, M represents a value obtained by dividing a frequency of a clock signal by a frequency of the pulse width modulation signal, M and N are integers larger than zero, and N≤M; the memory 603 is configured to store the correspondence between the output power and the value N; and the counter 604 is configured to generate the pulse width modulation signal according to the value N and the clock signal.

The Pulse Width Modulation (PWM) signal is a square signal having a variable duty ratio. The calculation equation of the duty ratio is D=(N/M)*100%, wherein M represents a value obtained by dividing the frequency of the clock signal by the frequency of the PWM signal, and N represents the number of continuous high levels in M continuous clock sequences. In a case where the frequency of the clock signal and the frequency of the PWM signal are fixed, i.e., M is fixed, the waveform of the PWM signal can be controlled by adjusting N.

In this embodiment, the power mapper 601 maps the in-band power into output power $P_{out}$ of the amplifier according to the mapping relationship between the in-band power and the output power of the amplifier, wherein $P_{out}$ is in the unit of dBm, and the range of $P_{out}$ is $P_0 \sim P_n$ (dBm). Specifically, the power mapper 601 may perform a power mapping calculation under the control of the sample control signal having a frequency $f_s$.

In this embodiment, the memory 603 pre-stores a Look-Up Table (LUT) reflecting the correspondence between the output power of the amplifier and the value N.

In this embodiment, the look-up table may be generated in multiple ways. For example, for the convenience of operation, the correspondence between the output power of the amplifier and the value N may be inputted into the processor inside the digital pre-distortion transmitter 100, so as to generate and store the look-up table into the memory 603. In addition, in order to simplify the operation of the digital pre-distortion transmitter 100, the look-up table may be generated in the general processor outside the digital pre-distortion transmitter 100, and then inputted and stored into the memory 603 through a data communication interface. Of course, the way for generating the look-up table is not limited to the above descriptions.

In the specific embodiment, the range $P_0 \sim P_n$ (dBm) of the output power is represented with n+1 discrete power values, i.e., $(P_0, P_0+\Delta, P_0+2\Delta, \ldots, P_0+n\Delta)$, wherein the interval between two adjacent power values is $\Delta$dBm, and $P_0+n\Delta=P_n$. The look-up table stores the correspondence between the n+1 discrete power values and the duty ratio parameter N. For example, a power value may be taken as an address of the memory, and corresponding N may be stored in the address, so as to construct a look-up table for the power values and N.

In the processor 602, the look-up table of the memory 603 is inquired according to the output power $P_{out}$ obtained by the power mapper 601, so as to obtain duty ratio parameter N corresponding to the output power. In the specific embodiment, for example when $P_0 < P_{out} \leq (P_0+\Delta)$, $P_{out}$ may correspond to the larger value $(P_0+\Delta)$ in this section, and value N corresponding to $(P_0+\Delta)$ may be taken as value N corresponding to $P_{out}$. Similarly, when $P_{out}$ falls within a section of other power values, the same method may be used to obtain corresponding value N, i.e., when $(P_0+k\Delta) < P_{out} \leq \{P_0+(k+1)\Delta\}$ (wherein k is a positive integer and $0 < k \leq n$), $P_{out}$ may correspond to the value $\{P_0+(k+1)\Delta\}$, and value N corresponding to $\{P_0+(k+1)\Delta\}$ may be taken as value N corresponding to $P_{out}$. In addition, when $P_{out} < P_0$, value N corresponding to $P_0$ may be taken as value N corresponding to $P_{out}$; and when $P_{out} > P_n$, value N corresponding to $P_n$ may be taken as value N corresponding to $P_{out}$. During the implementation, the processor 602 may work under the control of the sample control signal having a frequency $f_s$.

In the above embodiment, $P_{out}$ is mapped into the larger value $(P_0+\Delta)$ in the section $P_0 \sim (P_0+\Delta)$ for consideration of the system linearity, i.e., the supplied drain voltage rises with the increase of the mapped value, and the system linearity is also improved, otherwise the requirement of the system linearity cannot be satisfied.

Figure 7:
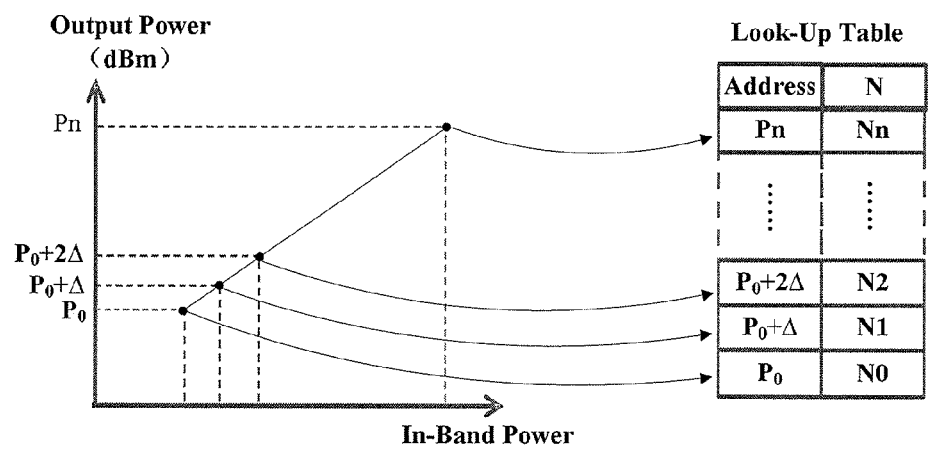
FIG. 7 is a schematic diagram of looking up value N according to an output power and a look-up table.

FIG. 7 is a schematic diagram of looking up value N according to an output power and a look-up table. As illustrated in FIG. 7, the processor 602 reads value N corresponding to the output power $P_{out}$ from the look-up table in the memory 603 according to the power value taken as the address of the memory.

After value N is obtained, the counter 604 generates a PWM signal according to value N and the clock signal. Specifically, as illustrated in FIG. 6, under the control of the clock signal having a frequency $f_{clk}$, the counter 604 generates N continuous high levels and (M-N) continuous low levels in M continuous clock sequences according to the duty ratio parameter N, so as to obtain the PWM signal corresponding to the output power $P_{out}$ (dBm) of the power amplifier. The outputted PWM signal is a digital signal, which is of either low level 0 or high level 1, thus the PWM signal only occupies 1 bit; in which, the clock generating the clock signal may be the inherent system clock in the digital pre-distortion transmitter 100, or a clock may be additionally set in the pulse width modulation signal generator 203 to generate the clock signal.

In the above embodiment, the memory 603 stores the look-up table for the output power and value N, thus the power mapper 601 is required to convert the in-band power into the output power of the power amplifier. However, in another embodiment, the look-up table for the in-band power and value N may be stored in the memory 603, thus the power mapper 601 is not needed, and value N corresponding to the in-band power can be directly obtained according to the in-band power and the look-up table, thereby obtaining the PWM signal corresponding to the in-band power.

In this embodiment, as illustrated in FIG. 2, the PWM signal generated by the pulse width modulation signal generator 203 is inputted into the buck converter 204, which works under a Direct Current (DC) power supply, and generates a dynamic drain voltage according to the PWM signal for the power amplifier 1024. The working mode of the buck converter 204 is similar to the relevant art, and herein is omitted.

As can be seen from the above embodiment, the digital pre-distortion transmitter 100 calculates the output power of the power amplifier based on the in-band power of the feedback signal, so as to adjust the drain bias voltage of the power amplifier, thereby adjusting the drain bias voltage based on the power tracking. Thus, the solution does not have a high requirement for the power change rate, and can obtain an exact power amplifier output power value. In addition, a PWM control signal of 1 bit is generated in the digital domain according to the fed back in-band power, which is simple and easily realizable, thereby avoiding the usage of DAC and reducing the system hardware cost. Moreover, the pre-distortion unit and the buck converter are used together, and the pre-distortion coefficient of the pre-distortion unit is updated by using the out-band power of the feedback signal, thereby modifying the nonlinearity of the power amplifier caused by the dynamic bias voltage, and further increasing the efficiency of the power amplifier.

Embodiment 3

Embodiment 3 of the present disclosure provides a digital pre-distortion transmitter on the basis of Embodiment 2, and the same contents are omitted herein.

This embodiment differs from Embodiment 2 in that a different pulse width modulation signal generator is used, which generates a pulse width modulation signal according to the voltage signal reflecting the in-band power obtained by the power calculator.

Next, the pulse width modulation signal generator in the embodiment of the present disclosure is described with reference to the drawing.

Figure 8:
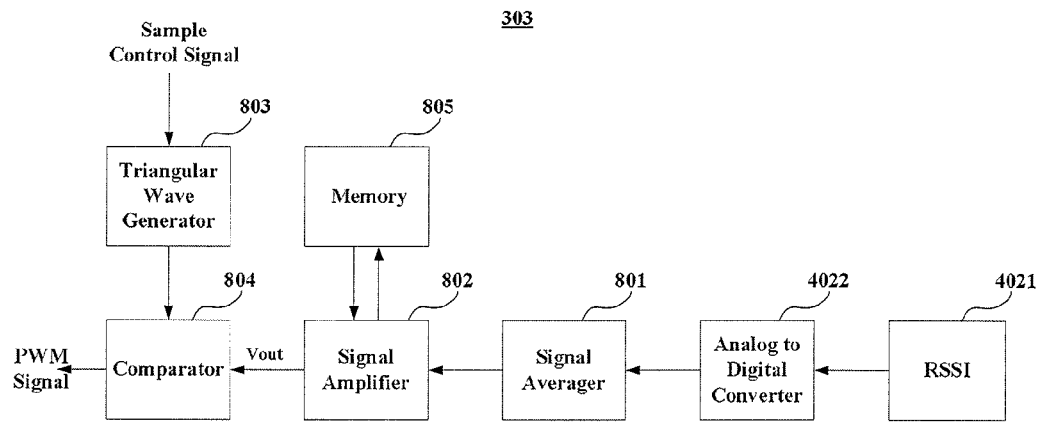
FIG. 8 is a schematic diagram of the structure of a pulse width modulation signal generator according to Embodiment 3 of the present disclosure.

FIG. 8 is a schematic diagram of the structure of a pulse width modulation signal generator according to Embodiment 3 of the present disclosure. As illustrated in FIG. 8, the pulse width modulation signal generator 303 includes a signal averager 801, a signal amplifier 802, a triangular wave generator 803 and a comparator 804;

in which, the signal averager 801 is configured to perform averaging processing on the voltage signal reflecting the in-band power to output an averaged voltage signal; the signal amplifier 802 is configured to perform amplification processing on the averaged voltage signal to generate an amplification signal; the triangular wave generator 803 is configured to generate a triangular wave having the same frequency as that of the pulse width modulation signal; and the comparator 804 is configured to compare an amplitude of the amplification signal with an amplitude of the triangular wave to generate the pulse width modulation signal.

In this embodiment, the voltage signal reflecting the in-band power may be a voltage signal related to the in-band power, such as the signal processed by the Received Signal Strength Indicator (RSSI) 4021 and the analog to digital converter 4022, as illustrated in FIG. 4.

The signal averager 801 performs averaging processing on the voltage signal reflecting the in-band power, so as to eliminate the fluctuation caused by the voltage signal and output an averaged voltage signal.

The signal amplifier 802 performs amplification processing on the averaged voltage signal, so as to generate an amplification signal. In one embodiment, the signal amplifier 802 multiplies the averaged voltage signal with a gain coefficient α, so as to obtain an amplification signal $V_{out}$.

The triangular wave generator 803 may use the sample control signal having a frequency $f_s$ as the control signal, so as to generate a triangular wave having the same frequency as that of the pulse width modulation signal.

In this embodiment, the triangular wave generator 803 may include an accumulator (not illustrated), so as to form a triangular wave signal having an amplitude $V_{tri}$, and set the frequency $f_{tri}$ of the triangular wave signal to be the same as that of the PWM signal.

In this embodiment, the comparator 804 compares the amplitude of the amplification signal $V_{out}$ with the amplitude $V_{tri}$ of the triangular wave, so as to generate the PWM signal. The PWM signal may be generated as follows:

a high level is outputted when $V_{out}$ is larger than $V_{tri}$; and
a low level is outputted when $V_{out}$ is smaller than $V_{tri}$.

In this embodiment, the pulse width modulation signal generator 303 may further include a memory 805 which pre-stores a look-up table for the correspondence between the averaged voltage signal and the gain coefficient α. The signal amplifier 802 may determine the gain coefficient α according to the averaged voltage signal and the look-up table in the memory 805.

Being similar to Embodiment 2, the averaged voltage signal may be taken as the address of the memory 805, and corresponding α may be stored in the address, so as to construct the look-up table for the averaged voltage signal and α. In this embodiment, the look-up table may also be generated in many ways. For example, in order to facilitate the operation, the correspondence between the averaged voltage signal and the gain coefficient α may be inputted into the processor inside the digital pre-distortion transmitter, so as to generate and store the look-up table into the memory 805. In addition, in order to simplify the operation of the digital pre-distortion transmitter, the look-up table may be generated in the general processor outside the digital pre-distortion transmitter, and then inputted and stored into the memory 805 through a data communication interface. Of course, the way for generating the look-up table is not limited to the above descriptions.

Figure 9:
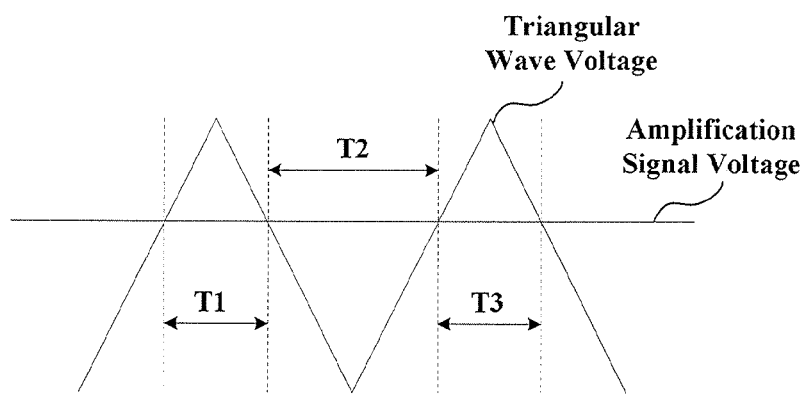
FIG. 9 is a principle diagram of generating a PWM signal duty ratio.

When the look-up table is specifically constructed, the gain coefficient α may be calculated on the basis of the principle diagram of generating a PWM signal duty ratio in FIG. 9. As illustrated in FIG. 9, T1, T2 and T3 are all time intervals, wherein T1 and T3 are time intervals where the voltage value of the amplification signal $V_{out}$ is smaller than the amplitude $V_{tri}$ of the triangular wave, and T2 is a time interval where the voltage value of the amplification signal $V_{out}$ is larger than the amplitude $V_{tri}$ of the triangular wave. Since the averaged voltage signal corresponds to the power of the amplifier, and each output power corresponds to a dynamic bias voltage having an optimum efficiency and corresponding to a duty ratio of a PWM signal, the duty ratio D of the PWM signal is dependent on the voltage value of the amplification signal $V_{out}$ after the amplitude $V_{tri}$ of the triangular wave, i.e., D=T2/(T3+T2). Thus, the gain coefficient α is obtained by dividing the voltage value of the amplification signal $V_{out}$ required for generating the duty ratio by the voltage value of the averaged voltage signal. Therefore, the mapping relationship between the averaged voltage signal and α is obtained and pre-stored in the look-up table.

As can be seen from the above embodiment, a PWM control signal of 1 bit is generated in the digital domain by performing amplification processing on the fed back voltage signal reflecting the in-band power and comparing the amplification-processed signal with the triangular wave. The method is simple and easily realizable, thereby avoiding the usage of the digital to analog converter, and reducing the system hardware cost.

Embodiment 4

Embodiment 4 of the present disclosure provides a digital pre-distortion transmitter. The present disclosure is further described on the basis of Embodiments 1 to 3, and the contents identical to those in Embodiments 1 to 3 are omitted herein.

Figure 10:
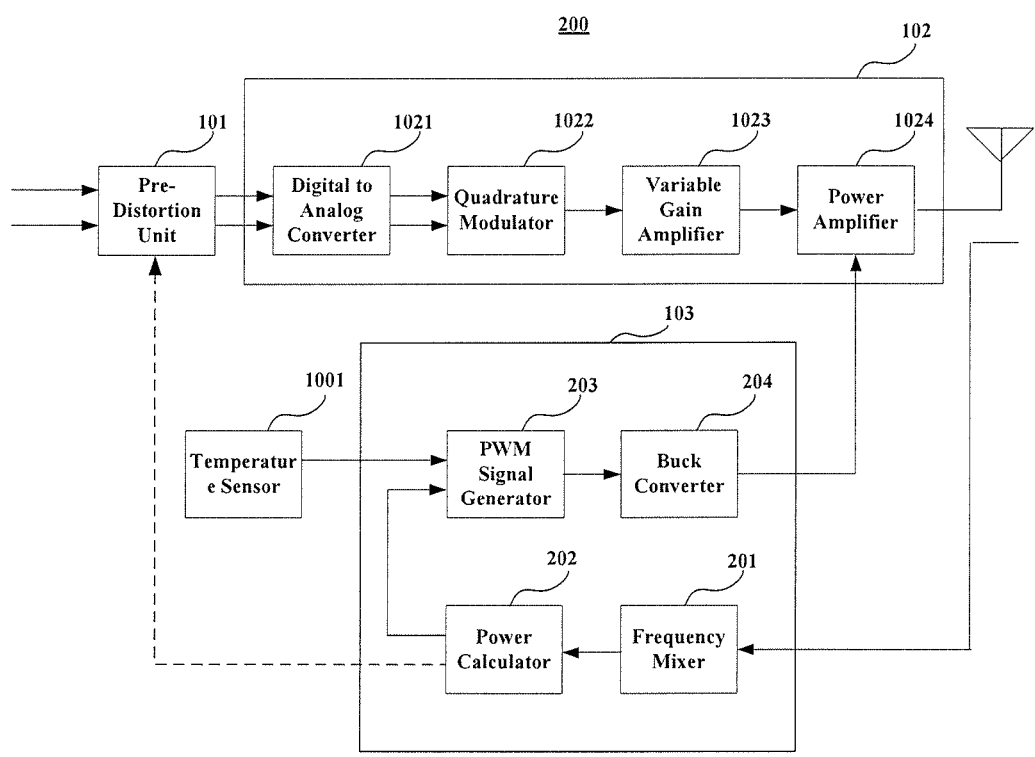
FIG. 10 is a schematic diagram of the structure of a digital pre-distortion transmitter according to Embodiment 4 of the present disclosure.

FIG. 10 is a schematic diagram of the structure of a digital pre-distortion transmitter according to Embodiment 4 of the present disclosure. As compared to Embodiments 1 to 3, the digital pre-distortion transmitter 200 in FIG. 10 further includes a temperature sensor 1001 configured to detect a temperature of the environment.

In that case, the pulse width modulation signal generator 1002 differs from those in Embodiments 2 and 3 in that the pulse width modulation signal generator 1002 is configured to generate the pulse width modulation signal according to the in-band power and the temperature detected by the temperature sensor. Thus, the pulse width modulation signal is generated in conjunction with the temperature detected by the temperature sensor 1001, so as to adjust the dynamic drain bias voltage more accurately.

In another embodiment, the temperature sensor 1001 may also be provided in the pulse width modulation signal generator 203.

Figure 11:
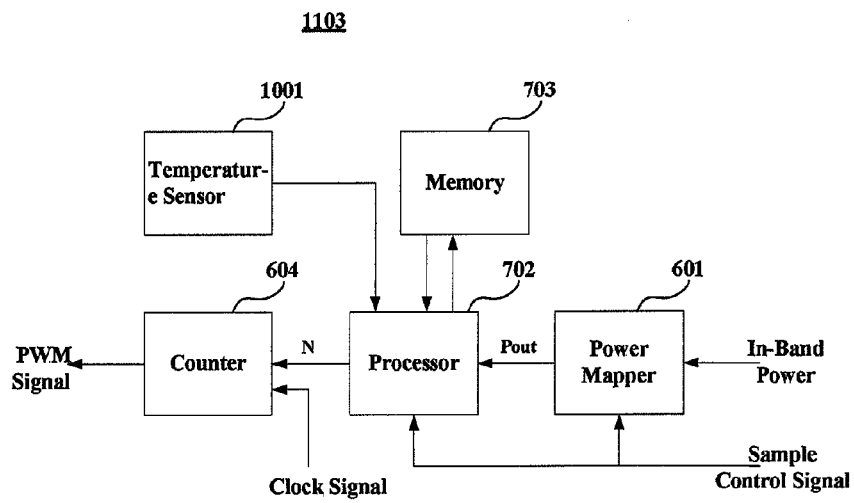
FIG. 11 is a schematic diagram of the structure of a pulse width modulation signal generator according to Embodiment 4 of the present disclosure.

FIG. 11 is a schematic diagram of the structure of a pulse width modulation signal generator according to Embodiment 4 of the present disclosure. As illustrated in FIG. 11, the pulse width modulation signal generator 1103 includes a power mapper 601, a processor 702, a memory 703, a counter 604 and a temperature sensor 1001;

in which, the structures of the power mapper 601 and the counter 604 are the same as those in Embodiment 1. The memory 703 pre-stores a look-up table for the correspondence between the output power, the temperature of the environment and the value N. The processor 702 looks up corresponding value N in the look-up table of the memory 703 according to the output power $P_{out}$ and the temperature of the environment.

Figure 12:
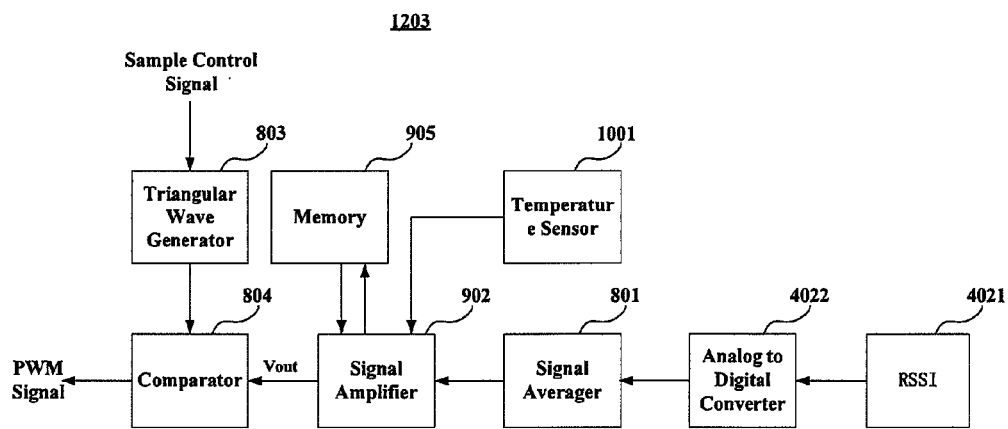
FIG. 12 is another schematic diagram of the structure of a pulse width modulation signal generator according to Embodiment 4 of the present disclosure.

FIG. 12 is another schematic diagram of the structure of a pulse width modulation signal generator according to Embodiment 4 of the present disclosure. As illustrated in FIG. 12, the pulse width modulation signal generator 1203 includes a signal averager 801, a signal amplifier 902, a triangular wave generator 803, a comparator 804, a memory 905 and a temperature sensor 1001;

in which, the structures of the signal averager 801, the triangular wave generator 803 and the comparator 804 are the same as those in Embodiment 2. The memory 905 pre-stores a look-up table for the correspondence between the averaged voltage signal, the temperature of the environment and the gain coefficient α. The signal amplifier 902 looks up corresponding gain coefficient α in the look-up table of the memory 905 according to the averaged voltage signal and the temperature of the environment.

In this embodiment, the digital pre-distortion transmitter further includes a temperature sensor, thus a pulse width modulation signal may be generated according to the in-band power, or the voltage signal reflecting the in-band power, and the temperature of the environment detected by the temperature sensor, so as to generate a dynamic drain bias voltage, thereby adjusting the dynamic drain bias voltage according to the power of the transmitter and the temperature of the environment.

Embodiment 5

Embodiment 5 of the present disclosure provides a method for controlling a digital pre-distortion transmitter. The method is corresponding to the digital pre-distortion transmitter in Embodiments 1 to 3, and the contents identical to those in Embodiments 1 to 3 are omitted herein.

Figure 13:
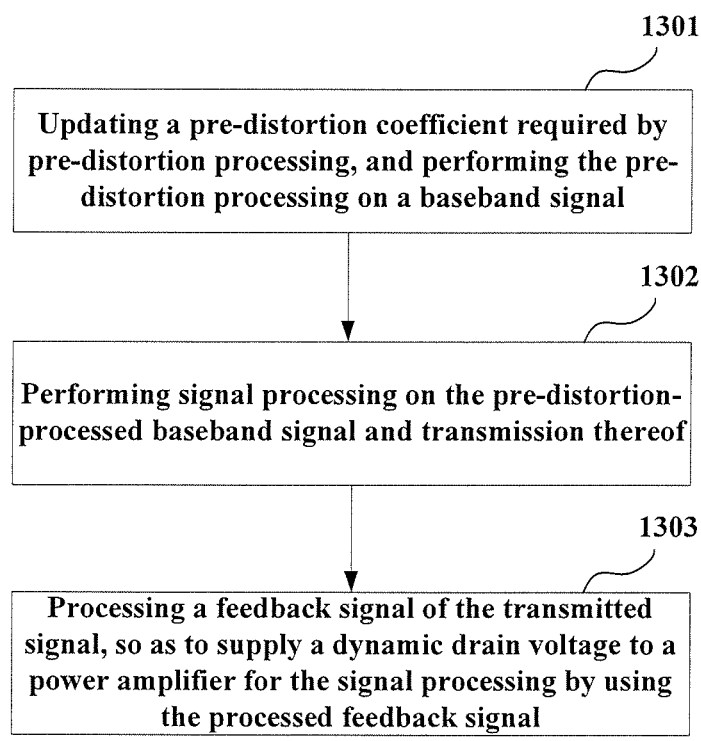
FIG. 13 is a flowchart of a method for controlling a digital pre-distortion transmitter according to Embodiment 5 of the present disclosure.

FIG. 13 is a flowchart of a method for controlling a digital pre-distortion transmitter according to Embodiment 5 of the present disclosure. As illustrated in FIG. 13, the method for controlling the digital pre-distortion transmitter includes:

Step 1301: updating a pre-distortion coefficient required by pre-distortion processing, and performing the pre-distortion processing on a baseband signal;

Step 1302: performing signal processing on the pre-distortion-processed baseband signal and transmission thereof; and Step 1303: processing a feedback signal of the transmitted signal, so as to supply a dynamic drain voltage to a power amplifier for the signal processing by using the processed feedback signal.

In this embodiment, please refer to the implementations of the pre-distortion unit 101, the signal process and transmit unit 102 and the feedback signal process unit 103 in Embodiments 1 to 3 for the implementations of steps 1301 to 1303. In the specific embodiment, the pre-distortion coefficient may be updated by using the processed feedback signal obtained in step 1303.

Figure 14:
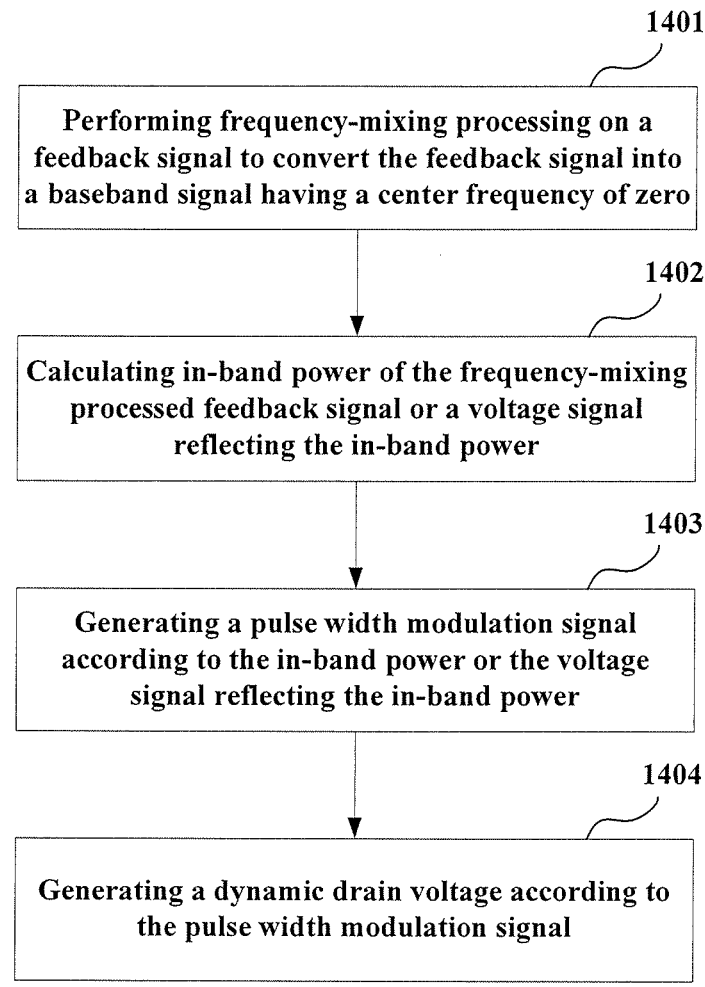
FIG. 14 is a flowchart of processing a feedback signal and supplying a dynamic drain voltage according to Embodiment 5 of the present disclosure.

FIG. 14 is a flowchart of processing a feedback signal according to Embodiment 5 of the present disclosure. As illustrated in FIG. 14, the method for processing the feedback signal and supplying the dynamic drain voltage includes:

Step 1401: performing frequency-mixing processing on the feedback signal to convert the feedback signal into a baseband signal having a center frequency of zero;

Step 1402: calculating in-band power of the frequency-mixing processed feedback signal or a voltage signal reflecting the in-band power;

Step 1403: generating a pulse width modulation signal according to the in-band power or the voltage signal reflecting the in-band power; and Step 1404: generating the dynamic drain voltage according to the pulse width modulation signal.

In this embodiment, please refer to the implementations of the frequency mixer 201, the power calculator 202, the pulse width modulation signal generator 203 and the buck converter 204 in Embodiment 1 for the implementations of steps 1401 to 1404.

Figure 15:
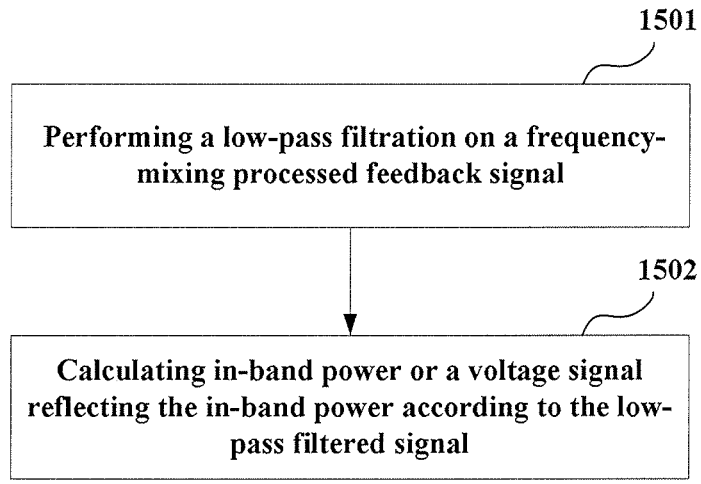
FIG. 15 is a flowchart of a method for calculating in-band power or a voltage signal reflecting the in-band power according to Embodiment 5 of the present disclosure.

FIG. 15 is a flowchart of a method for calculating in-band power or a voltage signal reflecting the in-band power according to Embodiment 5 of the present disclosure. As illustrated in FIG. 15, the method for calculating the in-band power includes:

Step 1501: performing a low-pass filtration on a frequency-mixing processed feedback signal;

Step 1502: calculating in-band power or a voltage signal reflecting the in-band power according to the low-pass filtered signal.

In this embodiment, please refer to the implementations of the low-pass filter 401 and the first power calculator 402 in Embodiment 1 for the implementations of steps 1501 and 1502.

In another embodiment, on the basis of the method of FIG. 15, a band-pass filtration for the frequency-mixing processed feedback signal may be performed, out-band power may be calculated according to the band-pass filtered signal, and a pre-distortion coefficient required for performing pre-distortion processing may be updated according to the out-band power. Please refer to the implementations of the band-pass filter 403 and the second power calculator 404 in Embodiment 2, wherein the out-band power may be out-band third order power.

Figure 16:
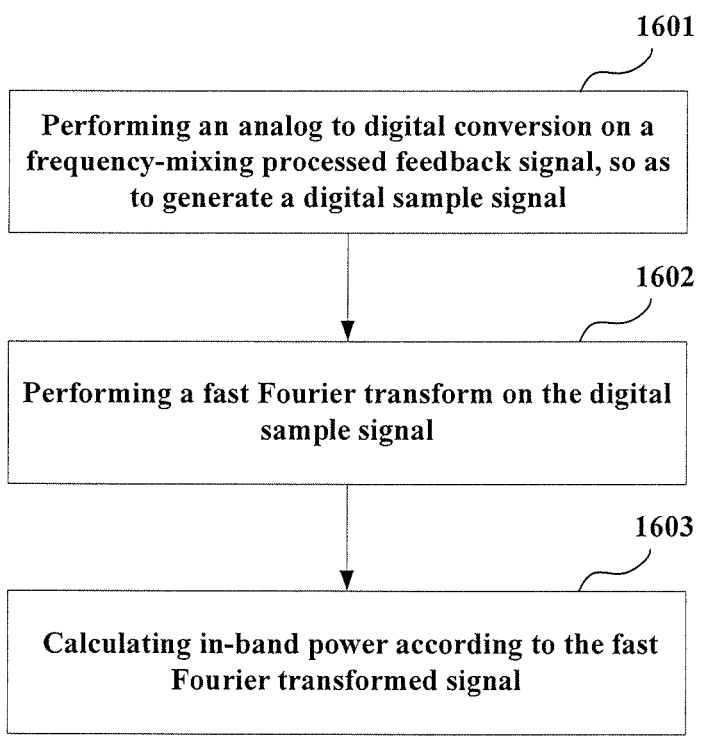
FIG. 16 is another flowchart of a method for calculating in-band power according to Embodiment 5 of the present disclosure.

FIG. 16 is another flowchart of a method for calculating in-band power according to Embodiment 5 of the present disclosure. As illustrated in FIG. 16, the method for calculating the in-band power includes:

Step 1601: performing an analog to digital conversion on a frequency-mixing processed feedback signal, so as to generate a digital sample signal;

Step 1602: performing a fast Fourier transform on the digital sample signal;

Step 1603: calculating in-band power according to the fast Fourier transformed signal.

In this embodiment, please refer to the implementations of the analog to digital converter 501, the fast Fourier transformer 502 and the in-band power calculator 503 in Embodiment 2 for the implementations of steps 1601 to 1603.

In another embodiment, on the basis of the method for calculating the in-band power in FIG. 16, out-band power may be calculated according to the fast Fourier transformed signal obtained in step 1602, and a pre-distortion coefficient required for performing pre-distortion processing may be updated according to the out-band power. Please refer to the implementation of the out-band power calculator 504 in Embodiment 2, wherein the out-band power may be out-band third order power.

Figure 17:
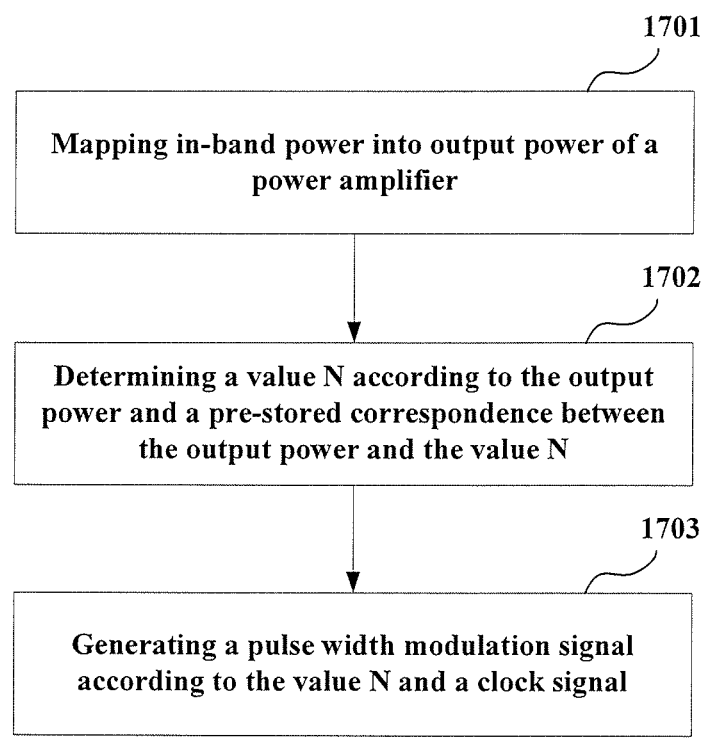
FIG. 17 is a flowchart of a method for generating a pulse width modulation signal according to Embodiment 5 of the present disclosure.

FIG. 17 is a flowchart of a method for generating a pulse width modulation signal according to Embodiment 5 of the present disclosure. As illustrated in FIG. 17, the method for generating the pulse width modulation signal includes:

Step 1701: mapping in-band power into output power of a power amplifier;

Step 1702: determining a value N according to the output power and a pre-stored correspondence between the output power and the value N;

Step 1703: generating a pulse width modulation signal according to the value N and a clock signal.

In this embodiment, please refer to the implementations of the power mapper 601, the processor 602, the memory 603 and the counter 604 in Embodiment 2 for the implementations of steps 1701 to 1703.

Figure 18:
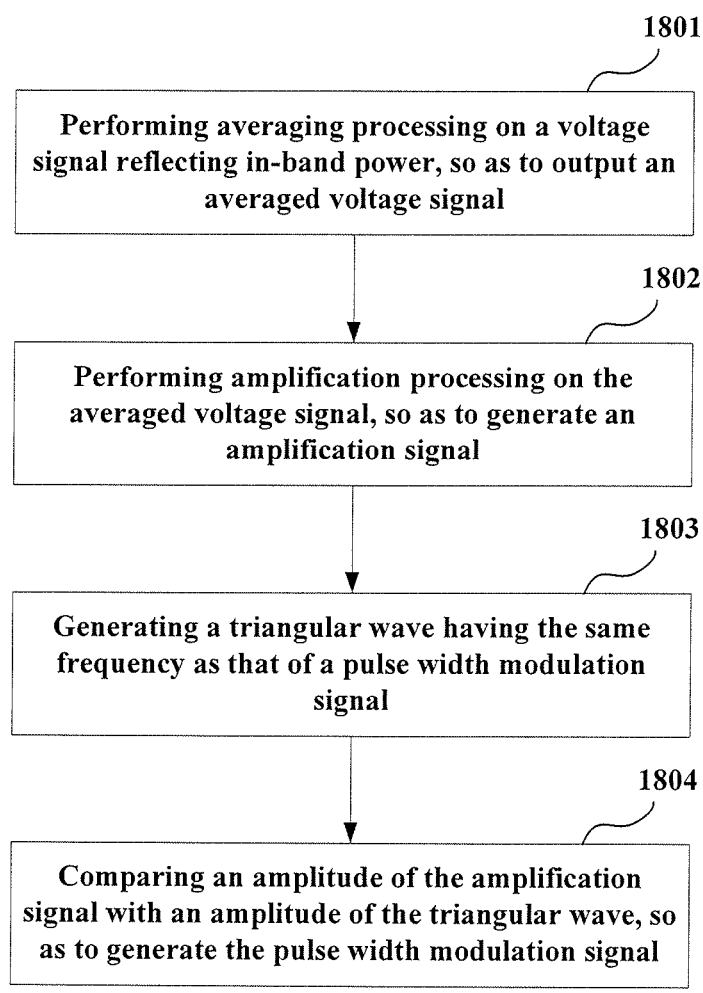
FIG. 18 is another flowchart of a method for generating a pulse width modulation signal according to Embodiment 5 of the present disclosure.

FIG. 18 is another flowchart of a method for generating a pulse width modulation signal according to Embodiment 5 of the present disclosure. As illustrated in FIG. 18, the method for generating the pulse width modulation signal includes:

Step 1801: performing averaging processing on a voltage signal reflecting in-band power, so as to output an averaged voltage signal;

Step 1802: performing amplification processing on the averaged voltage signal, so as to generate an amplification signal;

Step 1803: generating a triangular wave having the same frequency as that of a pulse width modulation signal;

Step 1804: comparing an amplitude of the amplification signal with an amplitude of the triangular wave, so as to generate the pulse width modulation signal.

In this embodiment, please refer to the implementations of the signal averager 801, the signal amplifier 802, the triangular wave generator 803 and the comparator 804 in Embodiment 3 for the implementations of steps 1801 to 1804.

The method for controlling the digital pre-distortion transmitter according to the embodiment of the present disclosure adjusts the drain bias voltage of the power amplifier based on the power tracking mode. Thus, the solution does not have a high requirement for the power change rate, and can obtain an exact output power value of the power amplifier. In addition, a PWM control signal of 1 bit is generated in the digital domain according to the fed back in-band power, which is simple and easily realizable, thereby avoiding the usage of DAC and reducing the system hardware cost. Moreover, the digital pre-distortion transmitter further updates the pre-distortion coefficient of the pre-distortion unit by using out-band power of the processed feedback signal, thereby not only modifying the nonlinearity of the power amplifier caused by the dynamic bias voltage, but also further increasing the efficiency of the power amplifier.

Embodiment 6

The embodiment of the present disclosure provides a method for controlling a digital pre-distortion transmitter. The method is corresponding to the digital pre-distortion transmitter in Embodiment 4, and the contents identical to those in Embodiment 4 are omitted herein.

In the method for controlling the digital pre-distortion transmitter in this embodiment, both the output power of the transmitter and the temperature of the environment are considered when the pulse width modulation signal is to be generated.

Figure 19:
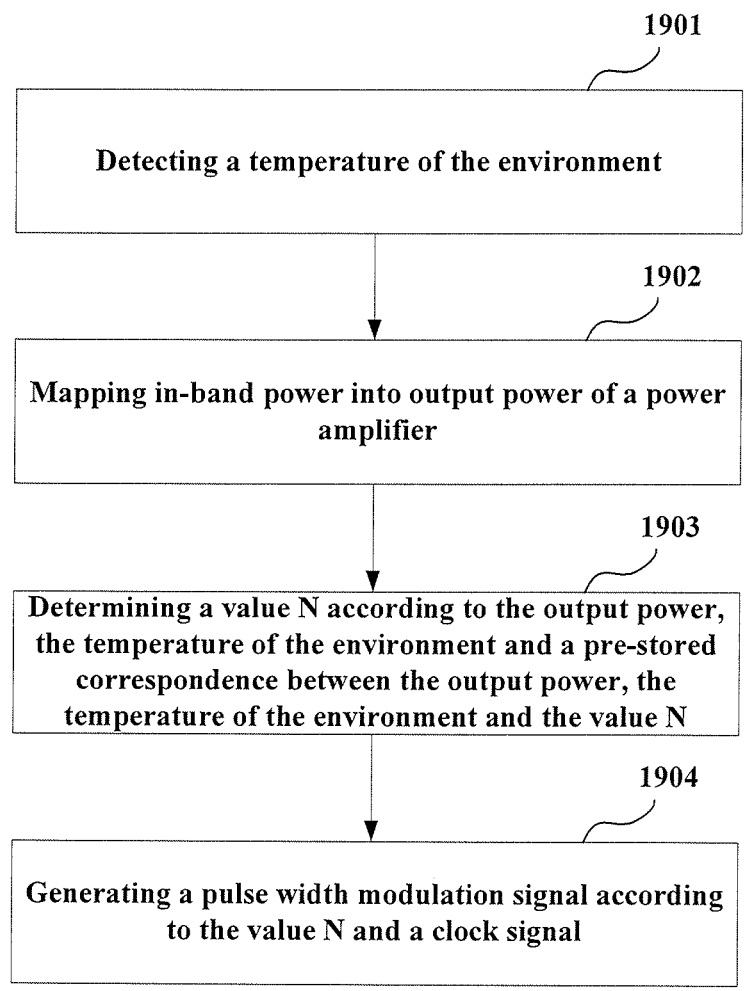
FIG. 19 is a flowchart of a method for generating a pulse width modulation signal according to Embodiment 6 of the present disclosure.

FIG. 19 is a flowchart of a method for generating a pulse width modulation signal according to Embodiment 6 of the present disclosure. The method including:

Step 1901: detecting a temperature of the environment;

Step 1902: mapping in-band power into output power of a power amplifier;

Step 1903: determining a value N according to the output power, the temperature of the environment and a pre-stored correspondence between the output power, the temperature of the environment and the value N;

Step 1904: generating a pulse width modulation signal according to the value N and a clock signal.

In this embodiment, please refer to the implementations of the temperature sensor 1001, the power mapper 601, the processor 702, the memory 703 and the counter 604 in Embodiment 4 for the implementations of steps 1901 to 1904.

Figure 20:
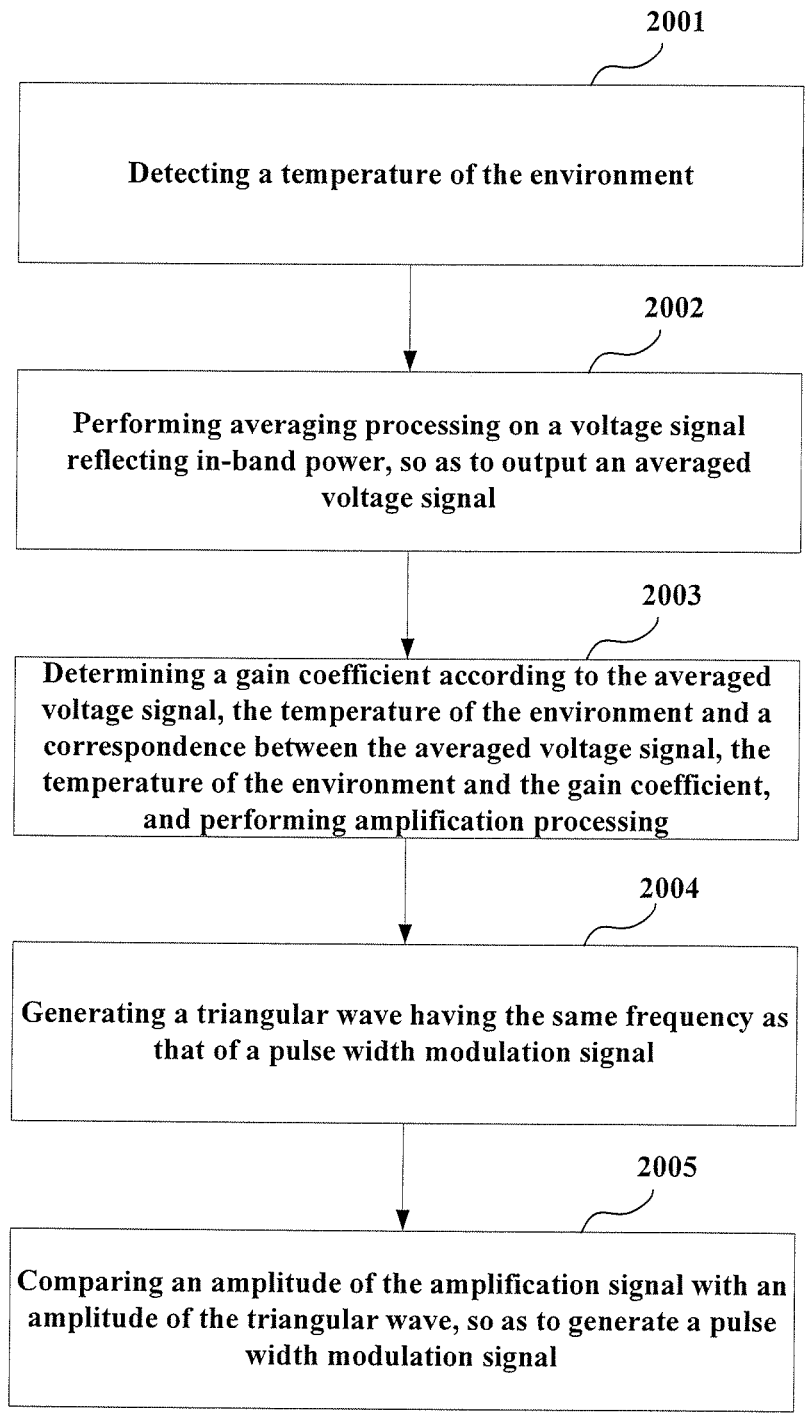
FIG. 20 is another flowchart of a method for generating a pulse width modulation signal according to Embodiment 6 of the present disclosure.

FIG. 20 is another flowchart of a method for generating a pulse width modulation signal according to Embodiment 6 of the present disclosure. The method includes:

Step 2001: detecting a temperature of the environment;

Step 2002: performing averaging processing on a voltage signal reflecting in-band power, so as to output an averaged voltage signal;

Step 2003: determining a gain coefficient according to the averaged voltage signal, the temperature of the environment and a correspondence between the averaged voltage signal, the temperature of the environment and the gain coefficient, and performing amplification processing on the averaged voltage signal according to the gain coefficient to generate an amplification signal;

Step 2004: generating a triangular wave having the same frequency as that of a pulse width modulation signal;

Step 2005: comparing an amplitude of the amplification signal with an amplitude of the triangular wave, so as to generate a pulse width modulation signal.

In this embodiment, please refer to the implementations of the temperature sensor 1001, the signal averager 801, the signal amplifier 902, the triangular wave generator 803, the comparator 804 and the memory 905 in Embodiment 4 for the implementations of steps 2001 to 2005.

In this embodiment, the pulse width modulation signal is generated according to the in-band power and the temperature of the environment detected by the temperature sensor, so as to generate a dynamic drain bias voltage, thereby adjusting the dynamic drain bias voltage according to the power of the transmitter and the temperature of the environment.

The above apparatus and method of the present disclosure may be implemented by hardware, or a combination of hardware and software. The present disclosure relates to such a computer readable program that enables a logic part to implement the previously described apparatuses or components, or implement the previously described methods or steps, when the program is executed by the logic part. The present disclosure also relates to a storage medium for storing the above program, e.g., hard disk, magnetic disk, optical disk, DVD and flash memory.

The present disclosure is described in conjunction with the above embodiments. But a person skilled in the art shall appreciate that the descriptions are just exemplary, rather than limitations to the protection scope of the present disclosure. A person skilled in the art can make various modifications and changes to the present disclosure under the spirit and principle of the present disclosure, and those modifications and changes are also within the scope of the present disclosure.

As for the embodiments including the above examples, the following excursuses are disclosed:

Excursus 1: A digital pre-distortion transmitter, including:
a pre-distortion unit configured to update a pre-distortion coefficient required by pre-distortion processing, and perform the pre-distortion processing on a baseband signal;
a signal process and transmit unit configured to perform signal processing on the pre-distortion-processed baseband signal and transmission thereof; and
a feedback signal process unit configured to process a feedback signal of the signal transmitted by the signal process and transmit unit, so as to supply a dynamic drain voltage to a power amplifier in the signal process and transmit unit by using the processed feedback signal;
wherein, the pre-distortion unit updates the pre-distortion coefficient by using the feedback signal processed by the feedback signal process unit.

Excursus 2: The digital pre-distortion transmitter according to excursus 1, wherein the feedback signal process unit includes:
a frequency mixer configured to convert the feedback signal into a baseband signal having a center frequency of zero;
a power calculator configured to calculate in-band power of the feedback signal processed by the frequency mixer or a voltage signal reflecting the in-band power, and out-band power for updating the pre-distortion coefficient;
a pulse width modulation signal generator configured to generate a pulse width modulation signal according to the in-band power or the voltage signal reflecting the in-band power; and
a buck converter configured to generate the dynamic drain voltage according to the pulse width modulation signal.

Excursus 3: The digital pre-distortion transmitter according to excursus 2, wherein the pulse width modulation signal generator includes:
a power mapper configured to map the in-band power into output power of the power amplifier;
a processor configured to determine a value N according to the output power and a pre-stored correspondence between the output power and the value N, wherein N represents the number of high levels in M continuous clock sequences, M represents a value obtained by dividing a frequency of a clock signal by a frequency of the pulse width modulation signal, and M and N are integers larger than zero;
a memory configured to store the correspondence between the output power and the value N; and
a counter configured to generate the pulse width modulation signal according to the value N and the clock signal.

Excursus 4: The digital pre-distortion transmitter according to excursus 2, wherein the pulse width modulation signal generator includes:
a signal averager configured to perform averaging processing on the voltage signal reflecting the in-band power to output an averaged voltage signal;
a signal amplifier configured to perform amplification processing on the averaged voltage signal to generate an amplification signal;
a triangular wave generator configured to generate a triangular wave having the same frequency as that of the pulse width modulation signal;
a comparator configured to compare an amplitude of the amplification signal with an amplitude of the triangular wave to generate the pulse width modulation signal.

Excursus 5: The digital pre-distortion transmitter according to excursus 2, further including:
a temperature sensor configured to detect a temperature of the environment;
wherein, the pulse width modulation signal generator is further configured to generate the pulse width modulation signal according to the in-band power or the voltage signal reflecting the in-band power, and the temperature detected by the temperature sensor.

Excursus 6: The digital pre-distortion transmitter according to excursus 3, wherein the pulse width modulation signal generator further includes:
a temperature sensor configured to detect a temperature of the environment;
and the processor determines the value N according to the output power, the temperature of the environment and a pre-stored correspondence between the output power, the temperature of the environment and the value N.

Excursus 7: The digital pre-distortion transmitter according to excursus 4, wherein the pulse width modulation signal generator further includes:
a temperature sensor configured to detect a temperature of the environment;
and the signal amplifier determines a gain coefficient according to the averaged voltage signal, the temperature of the environment and a correspondence between the averaged voltage signal, the temperature of the environment and the gain coefficient, and performs amplification processing on the averaged voltage signal according to the gain coefficient to generate the amplification signal.

Excursus 8: The digital pre-distortion transmitter according to excursus 2, wherein the power calculator includes:
a low-pass filter configured to perform a low-pass filtration on the feedback signal processed by the frequency mixer;
a first power calculator configured to calculate in-band power or a voltage signal reflecting the in-band power according to the low-pass filtered signal;
a band-pass filter configured to perform a band-pass filtration on the feedback signal processed by the frequency mixer; and
a second power calculator configured to calculate out-band power according to the band-pass filtered signal.

Excursus 9: The digital pre-distortion transmitter according to excursus 2, wherein the power calculator includes:
an analog to digital converter configured to perform an analog to digital conversion on the feedback signal processed by the frequency mixer, so as to generate a digital sample signal;
a fast Fourier transformer configured to perform a fast Fourier transform on the digital sample signal;

an in-band power calculator configured to calculate the in-band power according to the fast Fourier transformed signal; and an out-band power calculator configured to calculate the out-band power according to the fast Fourier transformed signal.

Excursus 10: The digital pre-distortion transmitter according to excursus 2, 8 or 9, wherein the out-band power is out-band third order power.

Excursus 11: A method for controlling a digital pre-distortion transmitter, including:

updating a pre-distortion coefficient required by pre-distortion processing, and performing the pre-distortion processing on a baseband signal;

performing signal processing on the pre-distortion-processed baseband signal and transmission thereof; and processing a feedback signal of the transmitted signal, so as to supply a dynamic drain voltage to a power amplifier for the signal processing by using the processed feedback signal;

wherein, the pre-distortion coefficient is updated by using the processed feedback signal.

Excursus 12: The method for controlling the digital pre-distortion transmitter according to excursus 11, wherein the processing the feedback signal of the transmitted signal, so as to supply the dynamic drain voltage to the power amplifier for the signal processing by using the processed feedback signal includes:

performing frequency-mixing processing on the feedback signal to convert the feedback signal into a baseband signal having a center frequency of zero;

calculating in-band power of the frequency-mixing processed feedback signal or a voltage signal reflecting the in-band power;

generating a pulse width modulation signal according to the in-band power or the voltage signal reflecting the in-band power; and generating the dynamic drain voltage according to the pulse width modulation signal.

Excursus 13: The method for controlling the digital pre-distortion transmitter according to excursus 12, wherein generating the pulse width modulation signal according to the in-band power includes:

converting the in-band power into output power of the power amplifier;

determining a value N according to the output power and a pre-stored correspondence between the output power and the value N, wherein N represents the number of high levels in M continuous clock sequences, M represents a value obtained by dividing a frequency of a clock signal by a frequency of the pulse width modulation signal, and M and N are integers larger than zero; and generating the pulse width modulation signal according to the value N and the clock signal.

Excursus 14: The method for controlling the digital pre-distortion transmitter according to excursus 12, wherein generating the pulse width modulation signal according to the voltage signal reflecting the in-band power includes:

performing averaging processing on the voltage signal reflecting the in-band power, so as to output an averaged voltage signal;

performing amplification processing on the averaged voltage signal, so as to generate an amplification signal;

generating a triangular wave having the same frequency as that of the pulse width modulation signal;

comparing an amplitude of the amplification signal with an amplitude of the triangular wave, so as to generate the pulse width modulation signal.

Excursus 15: The method for controlling the digital pre-distortion transmitter according to excursus 12, further including:

detecting a temperature of the environment; and generating the pulse width modulation signal according to the in-band power, or the voltage signal reflecting the in-band power, and the detected temperature of the environment.

Excursus 16: The method for controlling the digital pre-distortion transmitter according to excursus 13, wherein generating the pulse width modulation signal according to the in-band power further includes:

detecting a temperature of the environment; and determining a value N according to the output power, the temperature of the environment and a pre-stored correspondence between the output power, the temperature of the environment and the value N.

Excursus 17: The method for controlling the digital pre-distortion transmitter according to excursus 14, wherein generating the pulse width modulation signal according to the voltage signal reflecting the in-band power further includes:

detecting a temperature of the environment; and determining a gain coefficient according to the averaged voltage signal, the temperature of the environment and a correspondence between the averaged voltage signal, the temperature of the environment and the gain coefficient, and performing amplification processing on the averaged voltage signal according to the gain coefficient to generate the amplification signal.

Excursus 18: The method for controlling the digital pre-distortion transmitter according to excursus 12, wherein calculating the in-band power of the frequency-mixing processed feedback signal or the voltage signal reflecting the in-band power includes:

performing a low-pass filtration on a frequency-mixing processed feedback signal; and calculating the in-band power or the voltage signal reflecting the in-band power according to the low-pass filtered signal.

Excursus 19: The method for controlling the digital pre-distortion transmitter according to excursus 12, wherein calculating the in-band power of the frequency-mixing processed feedback signal includes:

performing an analog to digital conversion on the frequency-mixing processed feedback signal, so as to generate a digital sample signal;

performing a fast Fourier transform on the digital sample signal;

calculating the in-band power according to the fast Fourier transformed signal.

Excursus 20: The method for controlling the digital pre-distortion transmitter according to excursus 12, further including:

calculating out-band power of the frequency-mixing processed feedback signal, for updating the pre-distortion coefficient.

Excursus 21: The method for controlling the digital pre-distortion transmitter according to excursus 18, further including:

performing a band-pass filtration on the frequency-mixing processed feedback signal;

calculating out-band power according to the band-pass filtered signal, for updating the pre-distortion coefficient.

Excursus 22: The method for controlling the digital pre-distortion transmitter according to excursus 19, further including:

calculating out-band power according to the fast Fourier transformed signal, for updating the pre-distortion coefficient.

Excursus 23: The method for controlling the digital pre-distortion transmitter according to any of excursuses 20 to 22, wherein the out-band power is out-band third order power.

Excursus 24: A computer readable program, which enables a computer to implement the method for controlling the digital pre-distortion transmitter according to any of excursuses 11 to 23 in a transmitter, when the program is executed in the transmitter.

Excursus 25: A storage medium storing a computer readable program that enables a computer to implement the method for controlling the digital pre-distortion transmitter according to any of excursuses 11 to 23 in a transmitter.

The invention claimed is:

1. A digital pre-distortion transmitter, comprising:
a pre-distortion unit configured to update a pre-distortion coefficient required by pre-distortion processing, and perform the pre-distortion processing on a baseband signal;
a signal process and transmit unit configured to perform signal processing on the pre-distortion-processed baseband signal and transmission thereof; and
a feedback signal process unit configured to process a feedback signal of the signal transmitted by the signal process and transmit unit, so as to supply a dynamic drain voltage to a power amplifier in the signal process and transmit unit by using the processed feedback signal;
wherein the feedback signal process unit comprises:
a frequency mixer configured to convert the feedback signal into a baseband signal having a center frequency of zero;
a power calculator configured to calculate in-band power of the feedback signal processed by the frequency mixer or a voltage signal reflecting the in-band power, and out-band power for updating the pre-distortion coefficient;
a pulse width modulation signal generator configured to generate a pulse width modulation signal according to the in-band power or the voltage signal reflecting the in-band power; and
a buck converter configured to generate the dynamic drain voltage according to the pulse width modulation signal; and
wherein, the pre-distortion unit updates the pre-distortion coefficient by using the feedback signal processed by the feedback signal process unit.

2. The digital pre-distortion transmitter according to claim 1, wherein the pulse width modulation signal generator comprises:
a power mapper configured to map the in-band power into output power of the power amplifier;
a processor configured to determine a value N according to the output power and a pre-stored correspondence between the output power and the value N, wherein N represents the number of high levels in M continuous clock sequences, M represents a value obtained by dividing a frequency of a clock signal by a frequency of the pulse width modulation signal, and M and N are integers larger than zero;
a memory configured to store the correspondence between the output power and the value N; and
a counter configured to generate the pulse width modulation signal according to the value N and the clock signal.

3. The digital pre-distortion transmitter according to claim 1, wherein the pulse width modulation signal generator comprises:
a signal averager configured to perform averaging processing on the voltage signal reflecting the in-band power to output an averaged voltage signal;
a signal amplifier configured to perform amplification processing on the averaged voltage signal to generate an amplification signal;
a triangular wave generator configured to generate a triangular wave having the same frequency as that of the pulse width modulation signal;
a comparator configured to compare an amplitude of the amplification signal with an amplitude of the triangular wave to generate the pulse width modulation signal.

4. The digital pre-distortion transmitter according to claim 1, further comprising:
a temperature sensor configured to detect a temperature of the environment;
wherein, the pulse width modulation signal generator is further configured to generate the pulse width modulation signal according to the in-band power or the voltage signal reflecting the in-band power, and the temperature detected by the temperature sensor.

5. The digital pre-distortion transmitter according to claim 2, wherein the pulse width modulation signal generator further comprises:
a temperature sensor configured to detect a temperature of the environment; and
the processor determines the value N according to the output power, the temperature of the environment and a pre-stored correspondence between the output power, the temperature of the environment and the value N.

6. The digital pre-distortion transmitter according to claim 3, wherein the pulse width modulation signal generator further comprises:
a temperature sensor configured to detect a temperature of the environment; and
the signal amplifier determines a gain coefficient according to the averaged voltage signal, the temperature of the environment and a correspondence between the averaged voltage signal, the temperature of the environment and the gain coefficient, and performs amplification processing on the averaged voltage signal according to the gain coefficient to generate the amplification signal.

7. The digital pre-distortion transmitter according to claim 1, wherein the power calculator comprises:
a low-pass filter configured to perform a low-pass filtration on the feedback signal processed by the frequency mixer;
a first power calculator configured to calculate in-band power or a voltage signal reflecting the in-band power according to the low-pass filtered signal;
a band-pass filter configured to perform a band-pass filtration on the feedback signal processed by the frequency mixer; and
a second power calculator configured to calculate out-band power according to the band-pass filtered signal.

8. The digital pre-distortion transmitter according to claim 1, wherein the power calculator comprises:
an analog to digital converter configured to perform an analog to digital conversion on the feedback signal processed by the frequency mixer, so as to generate a digital sample signal;
a fast Fourier transformer configured to perform a fast Fourier transform on the digital sample signal;

an in-band power calculator configured to calculate the in-band power according to the fast Fourier transformed signal; and an out-band power calculator configured to calculate the out-band power according to the fast Fourier transformed signal.

9. The digital pre-distortion transmitter according to claim 1, wherein the out-band power is out-band third order power.

10. A method for controlling a digital pre-distortion transmitter, comprising:

updating a pre-distortion coefficient required by pre-distortion processing, and performing the pre-distortion processing on a baseband signal;

performing signal processing on the pre-distortion-processed baseband signal and transmission thereof; and processing a feedback signal of the transmitted signal, so as to supply a dynamic drain voltage to a power amplifier for the signal processing by using the processed feedback signal;

wherein, the pre-distortion coefficient is updated by using the processed feedback signal; and wherein the processing the feedback signal of the transmitted signal, so as to supply the dynamic drain voltage to the power amplifier for the signal processing by using the processed feedback signal comprises:

performing frequency-mixing processing on the feedback signal to convert the feedback signal into a baseband signal having a center frequency of zero;

calculating in-band power of the frequency-mixing processed feedback signal or a voltage signal reflecting the in-band power;

generating a pulse width modulation signal according to the in-band power or the voltage signal reflecting the in-band power; and generating the dynamic drain voltage according to the pulse width modulation signal.

11. The method for controlling the digital pre-distortion transmitter according to claim 10, wherein generating the pulse width modulation signal according to the in-band power comprises:

converting the in-band power into output power of the power amplifier;

determining a value N according to the output power and a pre-stored correspondence between the output power and the value N, wherein N represents the number of high levels in M continuous clock sequences, M represents a value obtained by dividing a frequency of a clock signal by a frequency of the pulse width modulation signal, and M and N are integers larger than zero; and generating the pulse width modulation signal according to the value N and the clock signal.

12. The method for controlling the digital pre-distortion transmitter according to claim 10, wherein generating the pulse width modulation signal according to the voltage signal reflecting the in-band power comprises:

performing averaging processing on the voltage signal reflecting the in-band power, so as to output an averaged voltage signal;

performing amplification processing on the averaged voltage signal, so as to generate an amplification signal;

generating a triangular wave having the same frequency as that of the pulse width modulation signal;

comparing an amplitude of the amplification signal with an amplitude of the triangular wave, so as to generate the pulse width modulation signal.

13. The method for controlling the digital pre-distortion transmitter according to claim 10, further comprising:

detecting a temperature of the environment; and generating the pulse width modulation signal according to the in-band power, or the voltage signal reflecting the in-band power, and the detected temperature of the environment.

14. The method for controlling the digital pre-distortion transmitter according to claim 11, wherein generating the pulse width modulation signal according to the in-band power further comprises:

detecting a temperature of the environment; and determining a value N according to the output power, the temperature of the environment and a pre-stored correspondence between the output power, the temperature of the environment and the value N.

15. The method for controlling the digital pre-distortion transmitter according to claim 12, wherein generating the pulse width modulation signal according to the voltage signal reflecting the in-band power further comprises:

detecting a temperature of the environment; and determining a gain coefficient according to the averaged voltage signal, the temperature of the environment and a correspondence between the averaged voltage signal, the temperature of the environment and the gain coefficient, and performing amplification processing on the averaged voltage signal according to the gain coefficient to generate the amplification signal.

16. The method for controlling the digital pre-distortion transmitter according to claim 10, wherein calculating the in-band power of the frequency-mixing processed feedback signal or the voltage signal reflecting the in-band power comprises:

performing a low-pass filtration on a frequency-mixing processed feedback signal; and calculating the in-band power or the voltage signal reflecting the in-band power according to the low-pass filtered signal.

17. The method for controlling the digital pre-distortion transmitter according to claim 10, wherein calculating the in-band power of the frequency-mixing processed feedback signal comprises:

performing an analog to digital conversion on the frequency-mixing processed feedback signal, so as to generate a digital sample signal;

performing a fast Fourier transform on the digital sample signal;

calculating the in-band power according to the fast Fourier transformed signal.

18. The method for controlling the digital pre-distortion transmitter according to claim 10, further comprising:

calculating out-band power of the frequency-mixing processed feedback signal, for updating the pre-distortion coefficient.

* * * * *